(12) United States Patent
Lin et al.

(10) Patent No.: US 12,406,742 B2
(45) Date of Patent: Sep. 2, 2025

(54) MEMORY DEVICE FOR PERFORMING IN-MEMORY COMPUTATION AND OPERATING METHOD THEREOF

(71) Applicant: MACRONIX INTERNATIONAL CO., LTD., Hsinchu (TW)

(72) Inventors: Yu-Yu Lin, New Taipei (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 236 days.

(21) Appl. No.: 18/312,630

(22) Filed: May 5, 2023

(65) Prior Publication Data

US 2024/0371453 A1 Nov. 7, 2024

(51) Int. Cl.

| G11C 17/18 | (2006.01) |
| G06F 7/544 | (2006.01) |
| G11C 17/16 | (2006.01) |
| G11C 13/00 | (2006.01) |

(52) U.S. Cl.
CPC ............ *G11C 17/18* (2013.01); *G06F 7/5443* (2013.01); *G11C 17/16* (2013.01); *G11C 13/0021* (2013.01)

(58) Field of Classification Search
CPC ............ G11C 13/0064; G11C 13/0004; G11C 2013/0073; G11C 2013/0088; G11C 13/0007; G11C 13/0061; G11C 2013/0083; G11C 13/0069

USPC .......................................................... 365/96
See application file for complete search history.

(56) References Cited

U.S. PATENT DOCUMENTS

| 2019/0244662 A1* | 8/2019 | Lee ................. H10B 63/30 |
| 2019/0286419 A1 | 9/2019 | Lin |
| 2022/0189526 A1 | 6/2022 | Gong |

FOREIGN PATENT DOCUMENTS

| CN | 111462798 A | 7/2020 |
| TW | 1682388 B | 1/2020 |
| TW | 202301336 A | 1/2023 |

\* cited by examiner

*Primary Examiner* — Amir Zarabian
(74) *Attorney, Agent, or Firm* — McClure, Qualey & Rodack, LLP

(57) ABSTRACT

A memory device for performing an in-memory computation, comprising a plurality of memory cells each stores a weight value and comprises a transistor and a resistor. A gate of the transistor receives an input voltage, the input voltage indicates an input value. When the transistor operates at a first operating point, the input voltage is equal to a first input voltage, when the transistor operates at a second operating point, the input voltage is equal to a second input voltage. The resistor is connected to a drain and a source of the transistor, when the resistor operates in a first state, the weight value is equal to a first weight value, when the resistor operates in a second state, the weight value is equal to a second weight value. Each of the memory cells performs a product computation of the input value and the weight value.

16 Claims, 6 Drawing Sheets

US 12,406,742 B2

MEMORY DEVICE FOR PERFORMING IN-MEMORY COMPUTATION AND OPERATING METHOD THEREOF

TECHNICAL FIELD

The disclosure relates to a semiconductor device and an operating method thereof, and more particularly, relates to a memory device for performing in-memory computation and an operating method thereof.

BACKGROUND

Artificial intelligence technology and big data processing technology have been widely used in all aspects of daily life. Artificial intelligence technology and big data processing technology rely on a large number of mathematical computations, such as neural network computations.

With the progress of semiconductor technology, in order to increase the computation speed, the above-mentioned mathematical computations may be performed inside the memory device, which is referred to as in-memory computation (IMC). In-memory computations include, for example, data searching, data comparison and sum-of-product computation.

In the sum-of-product computation, the memory cells of the memory device store weight values inside, and the memory cells receive input values from the outside. The memory cells perform sum-of-product computations based on the weight values and the input values, and the memory cells have a processing mechanism to change the weight values.

Those skilled in the art are devoted to improve the process and materials of the memory cells, expecting to capable of manufacturing the memory cells without additional masks, while the memory cells may still flexibly change the weight values.

SUMMARY

According to an aspect of the disclosure, a memory device for performing an in-memory computation is provided. The memory device comprises a plurality of memory cells, each of the memory cells stores a weight value, and each of the memory cells comprises a transistor and a resistor. The transistor has a gate, a drain and a source, the gate receives an input voltage, the input voltage indicates an input value, when the transistor operates at a first operating point, the input voltage is equal to a first input voltage, when the transistor operates at a second operating point, the input voltage is equal to a second input voltage, the second input voltage is higher than the first input voltage. The resistor is connected to the drain and the source of the transistor, when the resistor operates in a first state, the weight value is equal to a first weight value, when the resistor operates in a second state, the weight value is equal to a second weight value. Each of the memory cells performs a product computation of the input value and the weight value.

According to another aspect of the disclosure, an operating method of a memory device for performing an in-memory computation is provided. The memory device comprises a plurality of memory cells, each of the memory cells comprises a transistor and a resistor, the transistor has a gate, a drain and a source, the resistor is connected to the drain and the source of the transistor, and the operating method comprises the following steps. Receiving an input voltage through the gate of the transistor, the input voltage indicates an input value. Setting the input voltage as a first input voltage, so as to operate the transistor at a first operating point. Setting the input voltage as a second input voltage, so as to operate the transistor at a second operating point, the second input voltage is higher than the first input voltage. Storing a weight value by each of the memory cells. Operating the resistor in a first state, so as to set the weight value as a first weight value. Operating the resistor in a second state, so as to set the weight value as a second weight value. Performing a product computation of the input value and the weight value by each of the memory cells.

Figure 1:
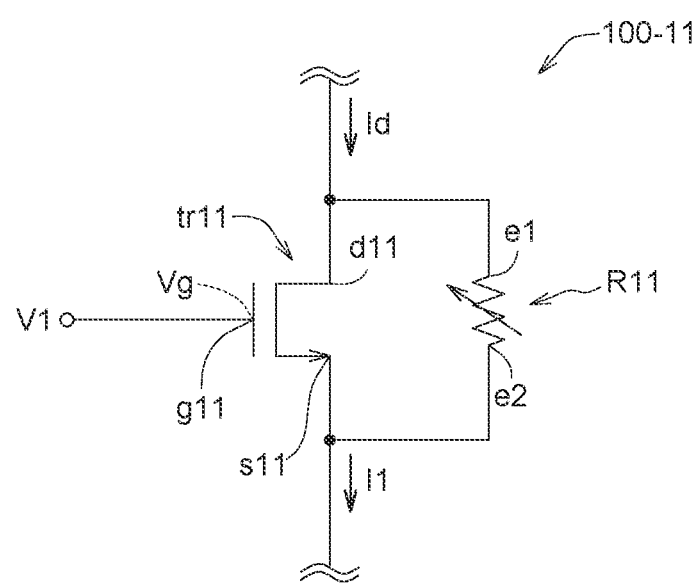
FIG. 1 is a schematic diagram of a memory cell according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

FIG. 1 is a schematic diagram of a memory cell 100-11 according to an embodiment of the disclosure. The memory cell 100-11 includes a transistor tr11 and a resistor R11, the transistor tr11 is connected to the resistor R11 in parallel. The transistor tr11 has a gate g11, a source s11 and a drain d11. The drain d11 is connected to the first end e1 of the resistor R11, and the source s11 is connected to the second end e2 of the resistor R11. The gate g11 receives the input voltage V1, and the gate voltage Vg of the gate g11 is equal to the input voltage V1.

The drain d11 of the transistor tr11 has a drain current Id, and the memory cell 100-11 has an output current I1. The output current I1 is equal to the sum of the drain current Id and the current of the resistor R11.

In one example, a plurality of memory cells may form a memory string. For example, the memory cell 100-11 and other memory cells (FIG. 1 does not show other memory cells) are connected in series to form a memory string. The source s11 of the transistor tr11 of the memory cell 100-11 may be coupled to the drain of the transistor of a neighboring memory cell. The drain current of the transistor of and the current of the resistor of each of the memory cells in the memory string are summed up to form the output current I1 of the memory string. The computation result of the sum-of-product computation performed by the memory string may be calculated according to the output current I1 (which will be described in detail in embodiments of following paragraphs with FIG. 4).

The resistor R11 is formed of a material having resistive characteristics. In one example, the resistor R11 is, for example, an "anti-fuse". In other examples, the resistor R11 is, for example, a one-time programmable memory (OTP memory), a multiple-time programmable memory (MTP memory), a Resistive Random Access Memory (ReRAM), or other types of non-volatile memory. Taking the anti-fuse as an example, the resistor R11 implements the characteristics of anti-fuse through the gate oxide breakdown mechanism. The resistor R11 operates in an initial state S_I and a programmed state S_P. The initial state S_I may be referred to as a "first state", and the programmed state S_P may be referred to as a "second state".

In the initial state S_I, the resistor R11 is equivalent to a state of being fused, and the resistor R11 is nearly being in a state of turned-OFF. Therefore, the resistor R11 has a first resistance value RH_af which is relatively high. On the other hand, after the programming operation is applied to the resistor R11, the gate oxide layer of the resistor R11 breaks down in response to the applied programming voltage, the state of the resistor R11 is converted to the programmed state S_P, and the resistor R11 is nearly being in a state of turned-ON. Therefore, the resistor R11 has a second resistance value RL_af which is relatively low. The second resistance value RL_af is lower than the first resistance value RH_af, which conforms to the relationship shown in formula (1):

$$RH\_af > RL\_af \quad (1)$$

As shown in Table 1, when the state of the resistor R11 is the initial state S_I, the resistor R11 is in a high-resistance state (high-R state) and has a relatively high first resistance value RH_af. In contrast, when the state of the resistor R11 is the programmed state S_P, the resistor R11 is in a low-resistance state (low-R state) and has a relatively low second resistance value RL_af.

TABLE 1

| State of resistor R11 | high-R state Initial state S_I | low-R state Programmed state S_P |
|---|---|---|
| Resistance value resistor R11 | The first resistance value RH_af | The second resistance value RL_af |

In another example, the resistor R11 may also be realized by a "fuse". The characteristics of the fuse are opposite to those of the anti-fuse described above. When the resistor R11 is a fuse, the resistor R11 in the initial state S_I has a relatively low second resistance value RL_af. After the programming operation is performed to the resistor R11, the resistor R11 is converted to the programmed state S_P, and the resistor R11 has a relatively high first resistance value RH_af.

On the other hand, the transistor tr11 is, for example, an N-type metal oxide semiconductor field effect transistor (N-type MOSFET), which is referred to as "N-type transistor". The gate g11 of the transistor tr11 receives the input voltage V1. When the input voltage V1 is a relatively high voltage, the channel of the transistor tr11 is substantially turned-on, and the transistor tr11 has a relatively low equivalent resistance. In contrast, when the input voltage V1 is a relatively low voltage, the channel of the transistor tr11 is substantially turned-off, and the transistor tr11 has a relatively high equivalent resistance value. The relationship between the input voltage V1 and the equivalent resistance value of the transistor tr11 will be described in detail below with reference to FIG. 2.

Figure 2:
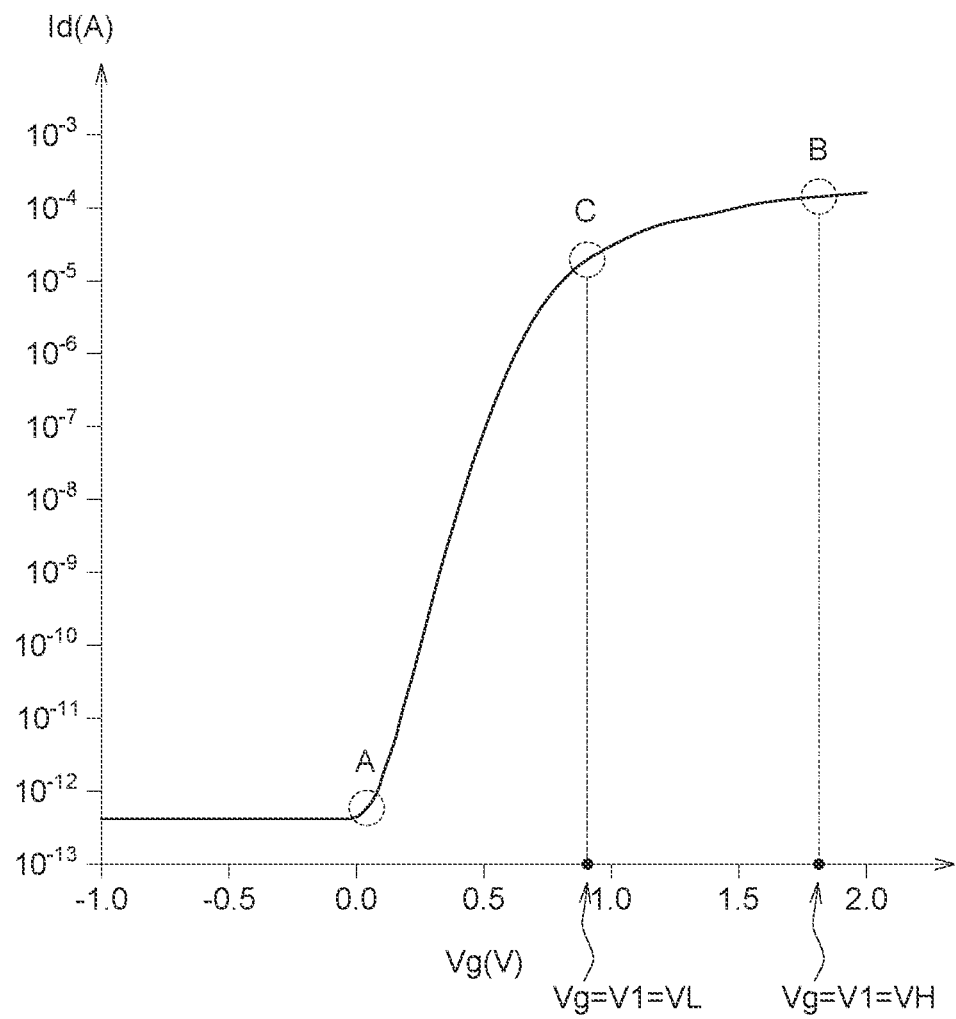
FIG. 2 is a current-voltage curve diagram of the drain current and the gate voltage of the transistor in FIG. 1.

FIG. 2 is a current-voltage curve diagram of drain current Id and gate voltage Vg of the transistor tr11 in FIG. 1. The gate voltage Vg of the transistor tr11 is equal to the input voltage V1. On the current-voltage curve of the drain current Id and the gate voltage Vg, different operating points of the transistor tr11 may be defined. At the operating point A, the input voltage V1 received by the transistor tr11 is 0V (i.e., the gate voltage Vg of the transistor tr11 is 0V). Since the gate voltage Vg of the transistor tr11 is very low, the channel of the transistor tr11 is almost completely-turned-off, and the equivalent resistance value of the transistor tr11 is very high. Therefore, the drain current Id of the transistor tr11 is very low, and the drain current Id is about $10^{-12}$ A.

When the memory cell 100-11 and other memory cells are connected in series to form a memory string, the source of the transistor and the resistor of the last memory cell in the memory string may be connected to a load capacitor CL_1 (not shown in FIG. 1). The drain current Id of the transistor of each of the memory cells in the memory string is added to the current of the resistor to form the output current I1 of the memory string, and the output current I1 charges the load capacitor CL_1.

The drain current Id at the operating point A has a much less current amount (approximately $5\times10^{-13}$ A), hence the current amount of the output current I1 of the memory string is much less, and the charging time T1 of the load capacitor CL_1 will be very long and exceed a reasonable range for measurement. Therefore, the transistor tr11 of this embodiment is not operated at the operating point A, instead, the input voltage V1 is increased (i.e., the gate voltage Vg is increased), so that the transistor tr11 is slightly turned-on, causing the transistor tr11 to operate at operating point C. The operating point C may be referred to as a "first operating point". Since the transistor tr11 is slightly turned-on, the transistor tr11 has a first equivalent resistance value RH_tr which is relatively high.

When the transistor tr11 is an N-type transistor, the gate voltage Vg at the operating point C is higher than the threshold voltage Vt of the transistor tr11 multiplied by a first ratio N1. In this embodiment, the first ratio N1 may be "½" or "⅓", and the gate voltage Vg at the operating point C is 0.9V, as shown in formula (2) or formula (3):

$$V1 = Vg = 0.9V > Vt \times 1/2 \quad (2)$$

$$V1 = Vg = 0.9V > Vt \times 1/3 \quad (3)$$

At the operating point C, in response to the gate voltage Vg of 0.9V, the current amount of the drain current Id increases to about $5\times10^{-5}$ A, hence the output current I1 of the memory string has an increased current amount, and the charging time T1 for the drain current Id to charge the load capacitor CL_1 may be within a reasonable range for measurement.

At the operating point C, the input voltage V1 of the transistor tr11 is equal to the first input voltage VL, and the first input voltage VL is 0.9V. The first input voltage VL is higher than the threshold voltage Vt multiplied by the first ratio N1.

On the other hand, the gate voltage Vg of the transistor tr11 is further increased to 1.8V, such that the transistor tr11 operates at the operating point B. The operating point B may be referred to as "the second operating point". At the operating point B, a greater degree of being-turned-on for the transistor tr11 is achieved, and the equivalent resistance value of the transistor tr11 is reduced to a second equivalent resistance value RL_tr. The second equivalent resistance value RL_tr is lower than the first equivalent resistance value RH_tr at the operating point C, which conforms to the relationship shown in formula (4-1):

$$RH\_tr > RL\_tr \qquad (4\text{-}1)$$

At the operating point B, the drain current Id of the transistor tr11 has a current amount increasing up to $5 \times 10^{-4}$ A. Therefore, the charging time T1 for the output current I1 of the memory string to charge the load capacitor CL_1 is also within a reasonable range for measurement. The input voltage V1 (equal to the gate voltage Vg) of the transistor tr11 is raised to a second input voltage VH. The second input voltage VH is, for example, 1.8V, and the second input voltage VH is higher than the first input voltage VL.

In one example, the relationship of the second equivalent resistance value RL_tr of the transistor tr11 at the operating point B and the first equivalent resistance value RH_tr at the operating point C may be defined according to a second ratio N2. For example, the first equivalent resistance value RH_tr is lower than or equal to a product of the second equivalent resistance value RL_tr and the second ration N2, wherein the second ration N2 is e.g., "1000", as shown in formula (4-2):

$$RH\_tr \le RL\_tr \times N2 \qquad (4\text{-}2)$$

According to formula (4-1) and formula (4-2), a relationship shown in formula (4-3) may be obtained:

$$RL\_tr < RH\_tr \le RL\_tr > N2 \qquad (4\text{-}3)$$

To sum up, the transistor tr11 has different equivalent resistance values at different operating points B and C on the relationship curve of the drain current Id and gate voltage Vg of FIG. 2.

At operating point C, the gate voltage Vg of the transistor tr11 is 0.9V, and the drain current Id of the transistor tr11 is approximately $5 \times 10^{-5}$ A, and the transistor tr11 is in a state of high resistance and has a higher first equivalent resistance value RH_tr. On the other hand, at operating point B, the gate voltage Vg of the transistor tr11 is 1.8V, and the drain current Id of the transistor tr11 is approximately $5 \times 10^{-4}$ A, and the transistor tr11 is in a state of low resistance and has a lower second equivalent resistance value RL_tr.

As shown in Table 2, at the operating point C, the input voltage V1 is equal to the relatively lower first input voltage VL (i.e., the first input voltage VL is equal to the gate voltage Vg of 0.9V), the transistor tr11 is in a high-resistance state having a first equivalent resistance RH_tr. In contrast, at the operating point B, the input voltage V1 is equal to the relatively higher second input voltage VH (i.e., the second input voltage VH is equal to the gate voltage Vg of 1.8V), the transistor tr11 is in a low-resistance state having a second equivalent resistance RL_tr.

TABLE 2

| State of transistor tr11 | high-R state | low-R state |
| --- | --- | --- |
| Operating point of transistor tr11 | Operating point C | Operating point B |
| Input voltage V1 | The first input voltage VL (equal to the gate voltage Vg of 0.9 V) | The second input voltage VH (equal to the gate voltage Vg of 1.8 V) |
| Drain current Id of transistor tr11 | $5 \times 10^{-5}$ A | $5 \times 10^{-4}$ A |
| Equivalent resistance value of transistor tr11 | The first equivalent resistance value RH_tr | The second equivalent resistance value RL_tr |

The first resistance value RH_af and the second resistance value RL_af of the resistor R11 are compared with the first equivalent resistance value RH_tr and the second equivalent resistance value RL_tr of the transistor tr11, the relationship shown in formula (5) may be obtained:

$$RH\_af > RH\_tr > RL\_tr > RL\_af \qquad (5)$$

In another example, the second resistance value RL_af of the resistor R11 is lower than the second equivalent resistance value RL_tr of the transistor tr11, and the relationship shown in formula (6) is obtained:

$$RRH\_af > RH\_tr > RL\_af > RL\_tr \qquad (6)$$

Figure 3:
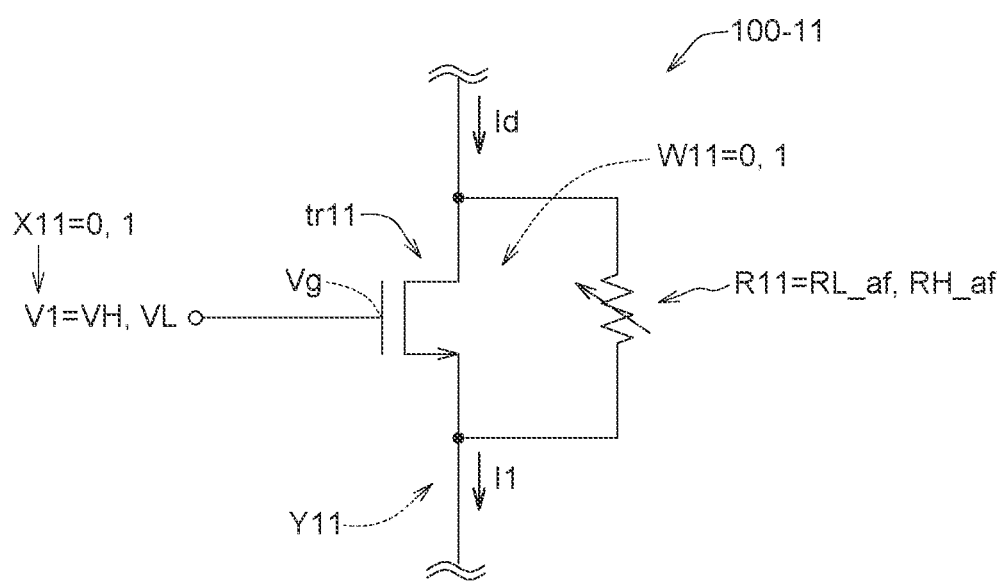
FIG. 3 is a schematic diagram of the memory cell in FIG. 1 performing computations.

FIG. 3 is a schematic diagram of the memory cell 100-11 in FIG. 1 performing computation. The memory cell 100-11 may perform a product computation (or multiplication computation). Referring to FIG. 3 (and refer to FIG. 2 in conjunction), the input voltage V1 of the transistor tr11 may represent the input value X11 of the memory cell 100-11. At the operating point C, the input voltage V1 of the transistor tr11 is equal to the first input voltage VL, which represents that the input value X11 of the memory cell 100-11 is a bit of "1". At the operating point B, the input voltage V1 of the transistor tr11 is equal to the second input voltage VH, which represents that the input value X11 of the memory cell 100-11 is a bit of "0".

On the other hand, the memory cell 100-11 stores a weight value W11, and the weight value W11 is used to perform an in-memory computation (IMC) in the memory cell 100-11. In this embodiment, in-memory computation is a product computation of the input value X11 and the weight value W11. The weight value W11 may be changed by changing the resistance value of the resistor R11, and the weight value W11 may be equal to a "first weight value" or a "second weight value". In this embodiment, the first weight value is a bit of "1", and the second weight value is a bit of "0". The resistor R11 has a first resistance value RH_af in the initial state S_I, at this time, the weight value W11 is equal to the first weight value (i.e., "1"). On the other hand, the resistor R11 has the second resistance value RL_af in the programmed state S_P, at this time, the weight value W11 is equal to the second weight value (i.e., "0").

The value of the weight value (i.e., the first weight value or the second weight value) may be changed by changing the state of the resistor R11 (i.e., the initial state S_I or the programmed state S_P) so that the resistor R11 has different resistance values. Therefore, there is no need to dispose additional masks in the manufacturing process of the memory cell 100-11 to change the value of the weight value W11. The memory cell 100-11 may adopt manufacturing process of logic circuit, such that the memory cell 100-11 may realize the in-memory computation.

Table 3 shows four conditions of the product computation of the input value X11 of the memory cell 100-11 and the weight value W11. In the first condition (cond-1), the input voltage V1 of the transistor tr11 is equal to the second input voltage VH, and the resistor R11 is in the programmed state S_P, indicating that the input value X11 is "0" and the weight value W11 is "0". The transistor tr11 has a second equivalent resistance value RL_tr, and the resistor R11 has a second resistance value RL_af, and the total equivalent resistance value of the memory cell 100-11 is substantially equal to the second resistance value RL_af.

In the third condition (cond-3), the input voltage V1 of the transistor tr11 is equal to the second input voltage VH, and the resistance R11 is in the initial state S_I, indicating that the input value X11 is "0" and the weight value W11 is "1". The transistor tr11 has a second equivalent resistance value RL_tr, and the resistor R11 has a first resistance value RH_af, the total equivalent resistance value of the memory cell 100-11 is equal to a parallel computation of the second equivalent resistance value RL_tr and the first resistance value RH_af. According to formula (5), the second equivalent resistance value RL_tr is lower than the first resistance value RH_af, hence the total equivalent resistance value of the memory cell 100-11 is substantially equal to the second equivalent resistance value RL_tr.

In the fourth condition (cond-4), the input voltage V1 of the transistor tr11 is equal to the first input voltage VL, and the resistance R11 is in the initial state S_I, indicating that the input value X11 is "1" and the weight value W11 is "1". The transistor tr11 has a first equivalent resistance value RH_tr, and the resistor R11 has a first resistance value RH_af, the total equivalent resistance value of the memory cell 100-11 is equal to a parallel computation of the first equivalent resistance value RH_tr and the first resistance value RH_af According to formula (5), the first equivalent resistance value RH_tr is lower than the first resistance value RH_af, hence the total equivalent resistance value of the memory cell 100-11 is substantially equal to the first equivalent resistance value RH_tr.

TABLE 3

| Product computation of the memory cell 100-1 | State of resistor R11<br>Programmed state S_P<br>Weight value W11 = "0"<br>(equal to the second weight value) | State of resistor R11<br>Initial state S_I<br>Weight value W11 = "1"<br>(equal to the first weight value) |
|---|---|---|
| Input voltage V1 = VH<br>Input value X11 = "0" | (cond-1)<br>RL_af//RL_tr ≅ RL_af<br>Product result Y11 = "0" | (cond-3)<br>RH_af//RL_tr ≅ RL_tr<br>Product result Y11 = "0" |
| Input voltage V1 = VL<br>Input value X11 = "1" | (cond-2)<br>RL_af//RH_tr ≅ RL_af<br>Product result Y11 = "0" | (cond-4)<br>RH_af//RH_tr ≅ RH_tr<br>Product result Y11 = "1" | resistance value RL_tr, and the resistor R11 has a second resistance value RL_af, and the total equivalent resistance value of the memory cell 100-11 is equal to a parallel computation of the second equivalent resistance value RL_tr and the second resistance value RL_af. According to formula (5), the second equivalent resistance value RL_tr is higher than the second resistance value RL_af, hence, the total equivalent resistance value of the memory cell 100-11 is substantially equal to the second resistance value RL_af.

In the second condition (cond-2), the input voltage V1 of the transistor tr11 is equal to the first input voltage VL, and the resistor R11 is in the programmed state S_P, indicating that the input value X11 is "1" and the weight value W11 is "0". The transistor tr11 has a first equivalent resistance value RH_tr, and the resistor R11 has a second resistance value RL_af, the total equivalent resistance value of the memory cell 100-11 is equal to the parallel computation of the first equivalent resistance value RH_tr and the second resistance value RL_af. According to formula (5), the first equivalent resistance value RH_tr is higher than the second resistance The product result Y11 shown in Table 3 is a result of product computation of the input value X11 and the weight value W11 of the memory cell 100-11. In one example, the total equivalent resistance value of the memory cell 100-11 may reflect the product result Y11.

The output current I1 of the memory cell 100-11 is equal to the sum of the drain current Id of the transistor tr11 and the current of the resistor R11. In another example, the output current I1 may also reflect the product result Y11 of the memory cell 100-11. When the memory cell 100-11 and other memory cells are connect in series to form a memory string, and the memory string is connected to a load capacitor CL_1 (not shown in FIG. 3), the output current of the memory cell 100-11 and the output currents of other memory cells are summed up to form the output current I1. The output current I1 charges the load capacitor CL_1, and the charging time T1 of the load capacitor CL_1 is related to the output current I1. Therefore, the charging time T1 may also reflect a sum-of-product result. The sum-of-product result of the memory string is a sum of the product result Y11 of each of the memory cells (which will be described in detail in embodiments in following paragraphs with FIG. 4).

When the data width of the input value X11 and the weight value W11 is one bit, the product computation of the input value X11 and the weight value W11 is equivalent to a logic "AND" operation.

In the first condition (cond-1) in Table 3, the input voltage V1 is equal to the second input voltage VH, and the total equivalent resistance value of the memory cell 100-11 is substantially equal to the second resistance value RL_af. Therefore, the output current I1 is related to the input voltage V1 divided by the second resistance value RL_af. Since the input voltage V1 is equal to the second input voltage VH which is relatively high, the second resistance value RL_af is a lower resistance value, therefore, the output current I1 has a higher current value, resulting in a shorter charging time T1. In the first condition (cond-1), the input value X11 is "0" and the weight value W11 is "0", hence the product result Y11 is "0", and the product result Y11 is reflected by the shorter charging time T1.

In the second condition (cond-2), the input voltage V1 is equal to the lower first input voltage VL, and the total equivalent resistance value of the memory cell 100-11 is substantially equal to the lower second resistance value RL_af. Therefore, the current value of the output current I1 in the second condition (cond-2) is slightly lower than that in the first condition (cond-1), resulting in a slight increase in the charging time T1. In the second condition (cond-2), the input value X11 is "1" and the weight value W11 is "0", hence the product result Y11 is "O".

In the third condition (cond-3), the input voltage V1 is equal to the higher second input voltage VH, and the total equivalent resistance value of the memory cell 100-11 is substantially equal to the lower second equivalent resistance value RL_tr, therefore, the current value of the output current I1 in the third condition (cond-3) is slightly increased as compared to that of the second condition (cond-2), resulting in a decrease of the charging time T1. In the third condition (cond-3), the input value X11 is "0" and the weight value W11 is "1", hence the product result Y11 is "O".

In the fourth condition (cond-4), the input voltage V1 is equal to the lower first input voltage VL, and the total equivalent resistance value of the memory cell 100-11 is substantially equal to the higher first equivalent resistance value RH_tr, therefore, the current value of the output current I1 in the fourth condition (cond-4) is greatly lower than that in the third condition (cond3), resulting in a greatly increase in the charging time T1. In the fourth condition (cond-4), the input value X11 is "1" and the weight value W11 is "1", hence the product result Y11 is "i", and the product result Y11 is reflected by the greatly increased charging time T1.

Figure 4:
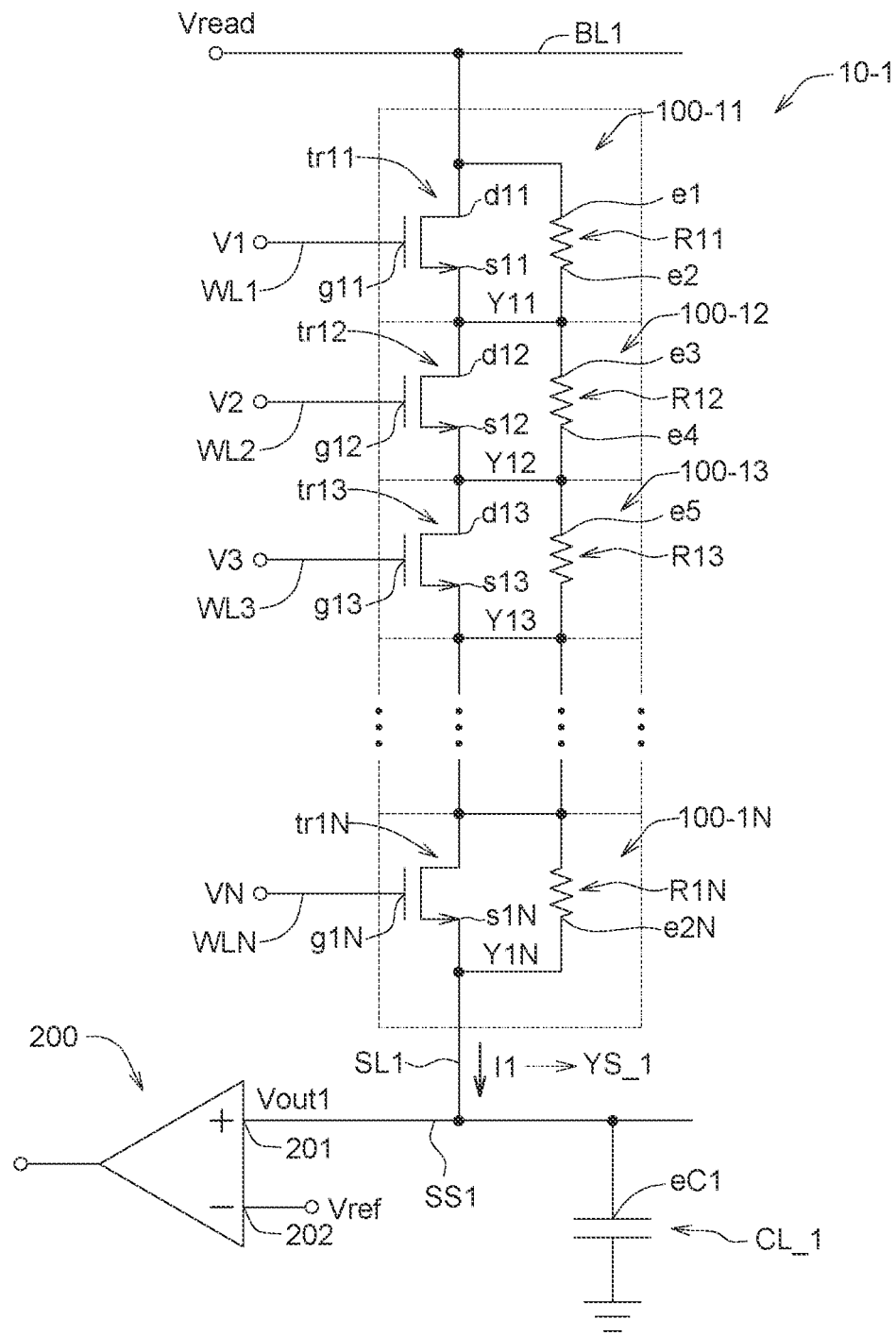
FIG. 4 is a schematic diagram of the memory string performing computations, according to an embodiment of the disclosure.

FIG. 4 is a schematic diagram of the memory string 10-1 performing computations according to an embodiment of the disclosure. As afore-mentioned, the memory cell 100-11 and other memory cells are connected in series to form a memory string. The source s11 of transistor tr11 of memory cell 100-11 may be coupled to the drain of transistor of neighboring memory cell. Drain current of transistor and current of resistor of each memory cell in the memory string are summed up to form the output current I1. The computation result of sum-of-product computation performed by the memory string may be calculated according to the output current I1. More particularly, as shown in FIG. 4, the memory string 10-1 includes N memory cells 100-11~100-1N. Each of the memory cells 100-11~100-1N is the same as the memory cell 100-11 in FIG. 1. For example, the memory cell 100-12 includes a transistor tr12 and a resistor R12 connected in parallel, the memory cell 100-13 includes a transistor tr13 and a resistor R13 connected in parallel, and so on. The memory string 10-1 is used to perform a sum-of-product computation, which sums up the respective product results Y11~Y1N of the memory cells 100-11~100-1N, so as to obtain a sum-of-product result YS_1.

The memory cells 100-11~100-1N are connected in series. For example, the source s11 of the transistor tr11 of the memory cell 100-11 is connected to the drain d12 of the transistor tr12 of the next neighboring memory cell 100-12, and the second end e2 of the resistor R11 is connected to the first end e3 of the resistor R12. Similarly, the source s12 of the transistor tr12 of the memory cell 100-12 is connected to the drain d13 of the transistor tr13 of the next neighboring memory cell 100-13, and the second end e4 of the resistor R12 is connected to the first end e5 of the resistor R13, and so forth.

The gate g11 of the transistor tr11 is connected to the first signal line WL1 to receive the input voltage V1, and the gate g12 of the next neighboring transistor tr12 is connected to the first signal line WL2 to receive the input voltage V2, and so on, the gate g1N of the Nth transistor tr1N (i.e., the last transistor in the memory string 10-1) is connected to the first signal line WLN to receive the input voltage VN. These first signal lines WL1~WLN are, for example, word lines.

For the first memory cell 100-11, the drain d11 of the transistor tr11 and the first end e1 of the resistor R11 are connected to the second signal line BL1, and the transistor tr11 and the resistor R11 receive the read voltage Vread through the second signal line BL1. The second signal line BL1 is, for example, a bit line.

For the Nth memory cell 100-1N (i.e., the last memory cell in the memory string 10-1), the source s1N of the transistor tr1N and the second end e2N of the resistor R1N are connected to the third signal line SL1. The memory cell 100-1N transmits the output current I1 through the third signal line SL1. The third signal line SL1 is, for example, a source line. The output current I1 and the output voltage Vout1 of the memory string 10-1 are transmitted to a sensing line SS1.

The first end eC1 of the load capacitor CL_1 is connected to the third signal line SL1 to receive the output current I1. That is, the source s1N of the transistor tr1N of the last memory cell 100-1N in the memory string 10-1 and the second end e2N of the resistor R1N are connected to the first end eC1 of the load capacitor CL_1, and the load capacitor CL_1 receives the output current I1 of the memory string 10-1. The output current I1 charges the load capacitor CL_1. The charging time T1 of the load capacitor CL_1 reflects the sum-of-product result YS_1 of the memory string 10-1.

The memory string 10-1 cooperates with the comparator 200. The input end 201 of the comparator 200 is connected to the first end eC1 of the load capacitor CL_1 through the sense line SS1. The input end 201 of the comparator 200 receives the voltage of the first end eC1 of the load capacitor CL_1 (which is equal to an output voltage Vout1). Another input end 202 of the comparator 200 receives a reference voltage Vref, and the comparator 200 compares the output voltage Vout1 with the reference voltage Vref.

At a starting time point t0, the memory string 10-1 starts to operate, and the output current I1 starts to charge the load capacitor CL_1. During the charging process, the voltage at the first end eC1 of the load capacitor CL_1 (which is equal to the output voltage Vout1) continues to increase. Then, at an ending time point t1, the voltage of the first end eC1 of the load capacitor CL_1 reaches the reference voltage Vref (i.e., the output voltage Vout1 is equal to the reference voltage Vref), indicating that the charging-level of the load capacitor CL_1 has met a predefined condition. The time difference between the ending time point t1 and the starting time point t0 may be defined as the charging time T1 of the load capacitor CL_1. The charging time T1 reflects the sum-of-product result YS_1 of memory string 10-1.

Figure 5:
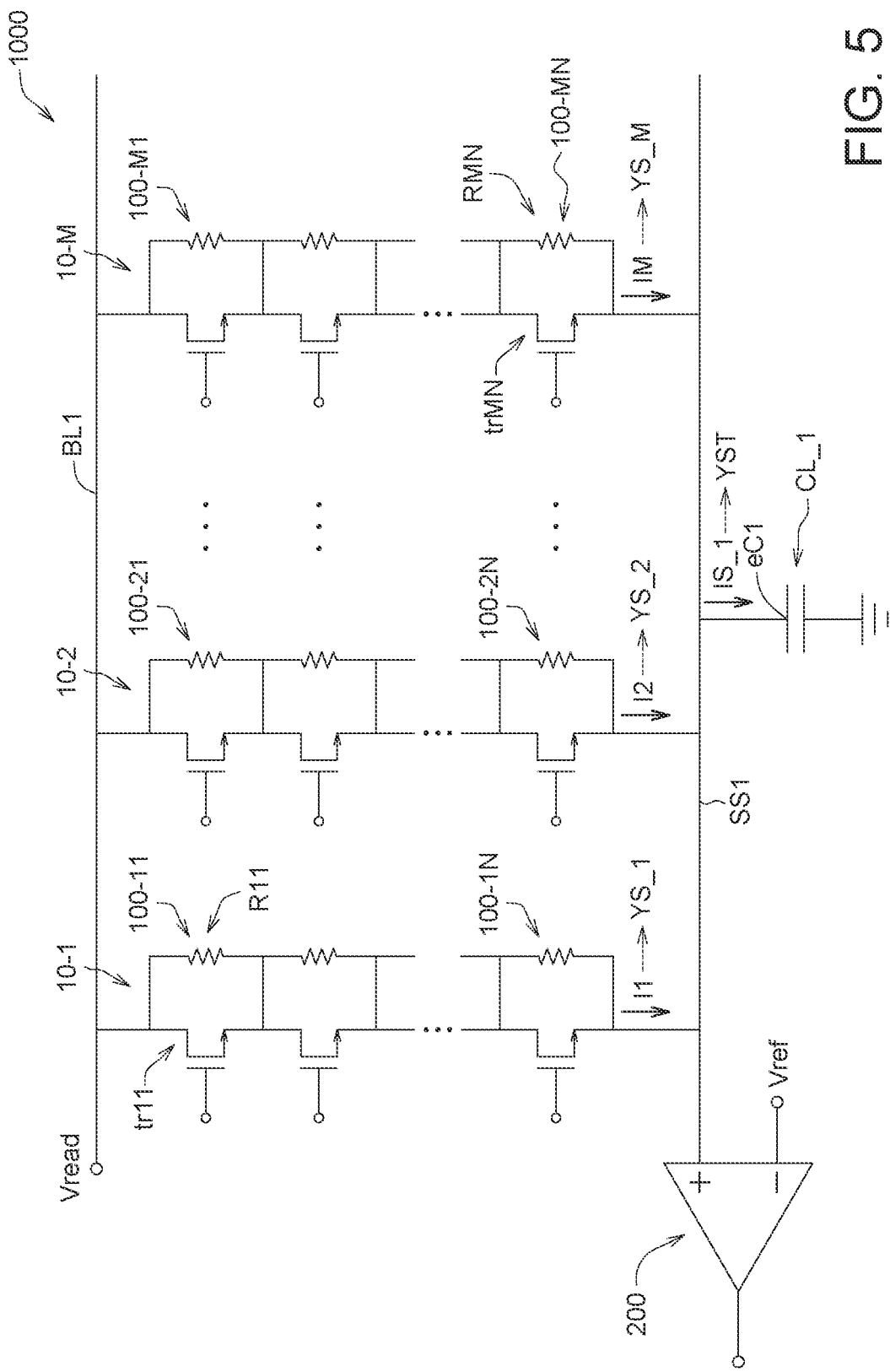
FIG. 5 is a schematic diagram of the memory device performing computations, according to an embodiment of the disclosure.

FIG. 5 is a schematic diagram of the memory device 1000 performing computations according to an embodiment of the disclosure. As shown in FIG. 5, the memory device 1000 includes M memory strings 10-1~10-M, and these memory strings 10-1~10-M form a memory array, with M being "24", for example. Each of the memory strings 10-1~10-M is the same as the memory string 10-1 in FIG. 4. For example, the memory string 10-2 includes N memory cells 100-21~100-2N. N is "32", for example. The memory strings 10-1~10-M are arranged in parallel. The total number of all memory cells 100-11~100-MN included in the memory device 1000 is M times N, for example, "32" times "24", which is equal to "768".

The memory cell 100-11 of the memory string 10-1, the memory cell 100-21 of the memory string 10-2, . . . , and the memory cell 100-M1 of the memory string 10-M are jointly connected to the second signal Line BL1 to receive the read voltage Vread.

The memory cell 100-1N of the memory string 10-1, the memory cell 100-2N of the memory string 10-2, . . . , and the memory cell 100-MN of the memory string 10-M are jointly connected to the sensing line SS1, and connected to the first end eC1 of the load capacitor CL_1 through the sensing line SS1. Memory string 10-1 generates output current I1, memory string 10-2 generates output current I2, and so on, memory string 10-M generates output current IM. The output currents I1~IM are transmitted to the sensing line SS1 and summed to form a total output current IS_1. The total output current IS_1 charges the load capacitor CL_1.

The memory device 1000 is used to perform a sum-of-product computation, and sum up the sum-of-product results YS_1~YS_M of the memory strings 10-1~10-M to obtain a total sum-of-product result YST. The charging time TS1 for the total output current IS_1 to charge the load capacitance CL_1 may reflect the total sum-of-product result YST.

In this embodiment, the component parameters and operating parameters of the memory device 1000 are listed as follows. The effective length of the channel under the oxide layer of respective transistors tr11~trMN of the memory cells 100-11~100-MN is e.g., 0.18 μm, and the effective width is e.g., 0.3 μm. The first resistance value RH_af of respective resistors R11~RMN of the memory cells 100-11~100-MN is e.g., 100MΩ, and the second resistance value RL_af is e.g., 1KΩ. The read voltage Vread received by the memory device 1000 through the second signal line BL1 is, for example, 0.5V. The capacitance value of the load capacitor CL_1 is e.g., 1 pf. The reference voltage Vref of the comparator 200 is e.g., 0.3V. When the voltage of the first end eC1 of the load capacitor CL_1 reaches 0.3V, the ending time point t1 is recorded, and the charging time T1 of the load capacitor CL_1 is computed accordingly.

Figure 6:
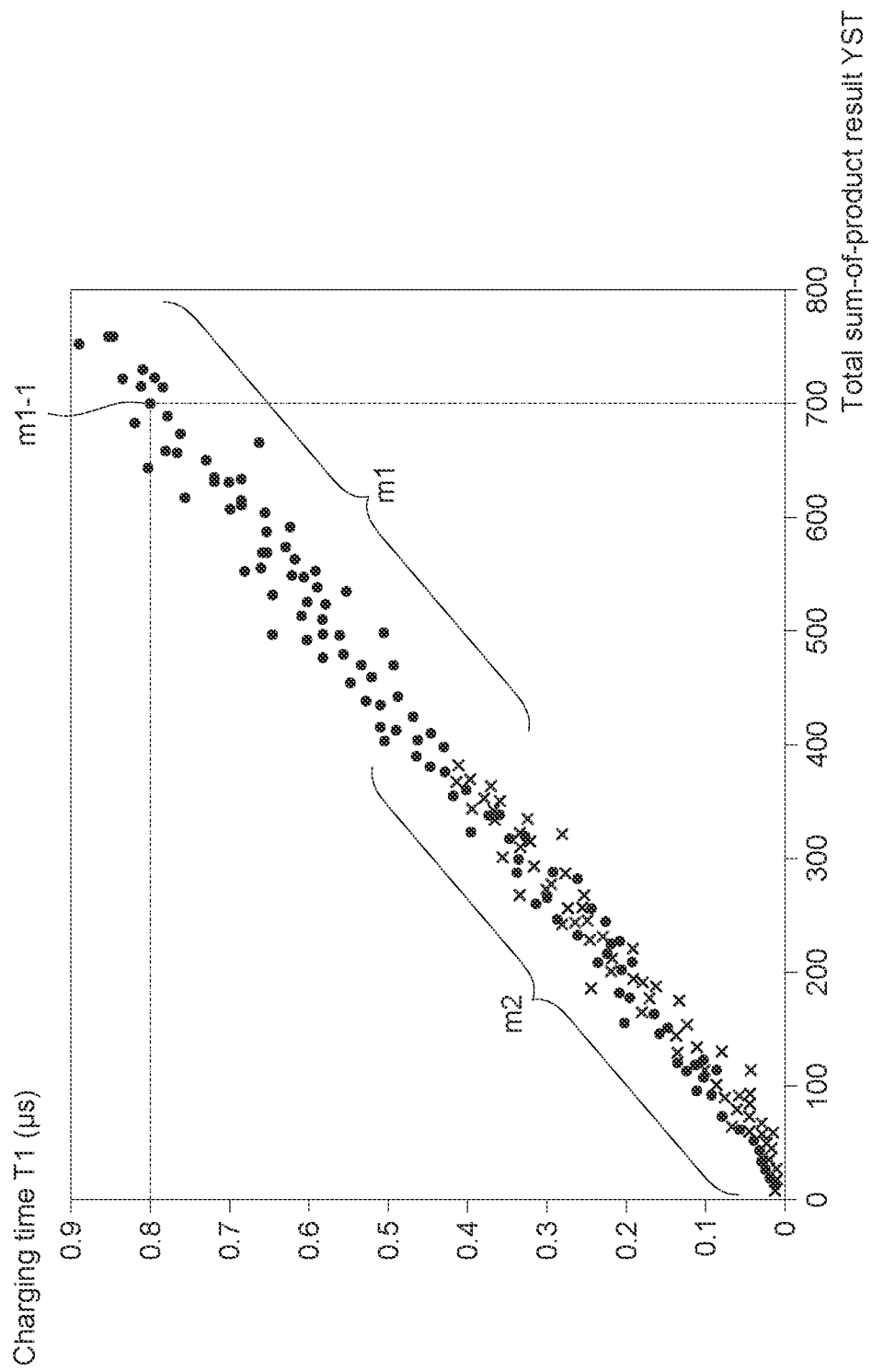
FIG. 6 is a measurement diagram of the computation results of the memory device in FIG. 5.

FIG. 6 is a measurement diagram of the computation results of the memory device 1000 in FIG. 5. The value on the horizontal axis of the measurement diagram in FIG. 6 represents the total sum-of-product result YST of sum-of-product computation performed by the memory device 1000, and the value on the vertical axis represents the charging time T1 of the load capacitor CL_1.

The measurement diagram includes a plurality of measurement points, and these measurement points are substantially divided into two types, including: a plurality of first measurement points m1 of a first type and a plurality of second measurement points m2 of a second type. Each of the first measurement points m1 is shown as a "thick black dot" and each of the second measurement points m2 is shown as a "short cross lines". When the weight values W11~WMN of the memory cells 100-11~100-MN of the memory device 1000 are all "1", the computation results of the memory device 1000 are displayed as the first measurement points m1. For example, one first measurement point m1-1 indicates that: the total sum-of-product result YST of the memory device 1000 is equal to "700", and the charging time T1 of the load capacitor CL_1 is equal to 0.8 μs.

On the other hand, when half of the weight values W11~WMN of the memory cells 100-11~100-MN of the memory device 1000 are "1", the computation results of the memory device 1000 are displayed as the second measurement points m2.

The first measurement points m1 and the second measurement points m2 substantially show a linear distribution, indicating that the charging time T1 of the load capacitor CL_1 is related to the total sum-of-product result YST of the memory device 1000.

It will be apparent to those skilled in the art that various modifications and variations may be made to the disclosed embodiments. It is intended that the specification and examples be considered as exemplary only, with a true scope of the disclosure being indicated by the following claims and their equivalents.

What is claimed is:

1. A memory device, for performing an in-memory computation, the memory device comprising:
   a plurality of memory cells, forming a plurality of memory strings each performing a sum-of-product computation that is a sum operation for a product computation of each of the memory cells, each of the memory cells stores a weight value, and each of the memory cells comprising:
     a transistor, having a gate, a drain and a source, the gate receives an input voltage, the input voltage indicates an input value, when the transistor operates at a first operating point, the input voltage is equal to a first input voltage, when the transistor operates at a second operating point, the input voltage is equal to a second input voltage, the second input voltage is higher than the first input voltage; and
     a resistor, connected to the drain and the source of the transistor, when the resistor operates in a first state, the weight value is equal to a first weight value, when the resistor operates in a second state, the weight value is equal to a second weight value,
   wherein, each of the memory cells performs the product computation of the input value and the weight value, and each of the memory strings is respectively connected to a load capacitor and generates an output current, and a charging time for the output current to charge the load capacitor reflects a sum-of-product result of the sum-of-product computation.

2. The memory device according to claim 1, wherein, the first weight value is a bit of "1", the second weight value is a bit of "0", when the input voltage is equal to the first input voltage, the input value is a bit of "1", when the input voltage is equal to the second input voltage, the input value is a bit of "0".

3. The memory device according to claim 2, wherein, the first input voltage is higher than a product of a threshold voltage of the transistor and a first ratio.

4. The memory device according to claim 1, wherein, the resistor is an anti-fuse, the first state is an initial state, and the second state is a programmed state, when the resistor operates in the initial state, the resistor has a first resistance value, when the resistor operates in the programmed state, the resistor has a second resistance value, and the first resistance value is higher than the second resistance value.

5. The memory device according to claim 4, wherein, when the transistor operates at the first operating point, the transistor has a first equivalent resistance value, when the transistor operates at the second operating point, the transistor has a second equivalent resistance value, the first equivalent resistance value is higher than the second equivalent resistance value.

6. The memory device according to claim 5, wherein, the first equivalent resistance value is lower than or equal to a product of the second equivalent resistance value and a second ratio.

7. The memory device according to claim 5, wherein:
the first resistance value is higher than the first equivalent resistance value;
the first equivalent resistance value is higher than the second equivalent resistance value; and
the second equivalent resistance value is higher than the second resistance value.

8. The memory device according to claim 5, wherein:
the first resistance value is higher than the first equivalent resistance value;
the first equivalent resistance value is higher than the second resistance value; and
the second resistance value is higher than the second equivalent resistance value.

9. An operating method of a memory device, for performing an in-memory computation, the memory device comprises a plurality of memory cells which form a plurality of memory strings each performing a sum-of-product computation that is a sum operation for a product computation of each of the memory cells, each of the memory cells comprises a transistor and a resistor, the transistor has a gate, a drain and a source, the resistor is connected to the drain and the source of the transistor, and the operating method comprising:
receiving an input voltage through the gate of the transistor, the input voltage indicates an input value;
setting the input voltage as a first input voltage, so as to operate the transistor at a first operating point;
setting the input voltage as a second input voltage, so as to operate the transistor at a second operating point, the second input voltage is higher than the first input voltage;
storing a weight value by each of the memory cells;
operating the resistor in a first state, so as to set the weight value as a first weight value;
operating the resistor in a second state, so as to set the weight value as a second weight value; and
performing the product computation of the input value and the weight value by each of the memory cells,
wherein each of the memory strings is respectively connected to a load capacitor and generates an output current, and a charging time for the output current to charge the load capacitor reflects a sum-of-product result of the sum-of-product computation.

10. The operating method according to claim 9, wherein, the first weight value is a bit of "1", the second weight value is a bit of "0", when the input voltage is equal to the first input voltage, the input value is a bit of "1", when the input voltage is equal to the second input voltage, the input value is a bit of "0".

11. The operating method according to claim 10, wherein, the first input voltage is higher than a product of a threshold voltage of the transistor and a first ratio.

12. The operating method according to claim 9, wherein, the resistor is an anti-fuse, the first state is an initial state, and the second state is a programmed state, when the resistor operates in the initial state, the resistor has a first resistance value, when the resistor operates in the programmed state, the resistor has a second resistance value, and the first resistance value is higher than the second resistance value.

13. The operating method according to claim 12, wherein, when the transistor operates at the first operating point, the transistor has a first equivalent resistance value, when the transistor operates at the second operating point, the transistor has a second equivalent resistance value, the first equivalent resistance value is higher than the second equivalent resistance value.

14. The operating method according to claim 13, wherein, the first equivalent resistance value is lower than or equal to a product of the second equivalent resistance value and a second ratio.

15. The operating method according to claim 13, wherein:
the first resistance value is higher than the first equivalent resistance value;
the first equivalent resistance value is higher than the second equivalent resistance value; and
the second equivalent resistance value is higher than the second resistance value.

16. The operating method according to claim 13, wherein:
the first resistance value is higher than the first equivalent resistance value;
the first equivalent resistance value is higher than the second resistance value; and
the second resistance value is higher than the second equivalent resistance value.

* * * * *